United States Patent
Lee (10) Patent No.: US 10,777,593 B2
(45) Date of Patent: Sep. 15, 2020

(54) GLOBAL SHUTTER CMOS IMAGE SENSOR AND METHOD FOR FORMING THE SAME

(71) Applicant: Silicon Optronics, Inc., Hsinchu (TW)

(72) Inventor: Bo-Ray Lee, Hsinchu (TW)

(73) Assignee: Silicon Optronics, Inc., Hsinchu (TW)

( * ) Notice: Subject to any disclaimer, the term of this patent is extended or adjusted under 35 U.S.C. 154(b) by 0 days.

(21) Appl. No.: 16/371,515

(22) Filed: Apr. 1, 2019

(65) Prior Publication Data
US 2019/0393255 A1    Dec. 26, 2019

(30) Foreign Application Priority Data
Jun. 22, 2018   (TW) ............................. 107121497 A (51) Int. Cl.
*H01L 27/146* (2006.01)

(52) U.S. Cl.
CPC .. *H01L 27/14623* (2013.01); *H01L 27/14621* (2013.01); *H01L 27/14627* (2013.01); *H01L 27/14645* (2013.01); *H01L 27/14685* (2013.01); *H01L 27/14689* (2013.01)

(58) Field of Classification Search
None
See application file for complete search history.

(56) References Cited

U.S. PATENT DOCUMENTS

| 8,921,966 B2 * | 12/2014 | Kishi ................ H01L 27/14623 257/432 |
| 9,842,875 B2 | 12/2017 | Fan et al. |
| 2007/0045511 A1 * | 3/2007 | Lee ................... H01L 27/14623 250/208.1 |
| 2008/0073740 A1 * | 3/2008 | Shibayama ....... H01L 27/14618 257/434 |

(Continued)

FOREIGN PATENT DOCUMENTS

| TW | 200511569 A | 3/2005 |
| TW | 200715544 A | 4/2007 |
| TW | I481018 B | 4/2015 |

OTHER PUBLICATIONS

Barron, L., "High-reflectance, sputter-deposited aluminum alloy thin thin films for micro-electro-mechanical systems", Rochester Institute of Technology dissertation in Materials Science and Engineering Department, 2005. (Year: 2005).*

*Primary Examiner* — J. E. Schoenholtz
(74) *Attorney, Agent, or Firm* — Muncy, Geissler, Olds & Lowe, P.C.

(57) ABSTRACT

A global shutter CMOS image sensor includes a photodiode, a floating diffusion region, and a storage diode disposed in the upper portion of the substrate. The storage diode is disposed between the photodiode and the floating diffusion region. A first transfer gate is disposed on the substrate between the photodiode and the storage node. A second transfer gate is disposed on the substrate between the storage diode and the floating diffusion region. A first dielectric layer (Continued)

is disposed on the substrate and covers the first transfer gate and the second transfer gate. A light-shielding layer is disposed on the first dielectric layer. A light pipe is disposed through the light-shielding layer and a portion of the first dielectric layer, and is correspondingly disposed above the photodiode. The light pipe has a higher refractive index than the first dielectric layer.

19 Claims, 7 Drawing Sheets

(56) References Cited

U.S. PATENT DOCUMENTS

| | | | | |
|---|---|---|---|---|
| 2010/0116976 | A1* | 5/2010 | Wober | B82Y 20/00 250/227.23 |
| 2010/0163714 | A1* | 7/2010 | Wober | G02B 6/4204 250/227.2 |
| 2012/0012964 | A1* | 1/2012 | Kishi | H01L 27/14623 257/435 |
| 2013/0089963 | A1* | 4/2013 | Mishima | H01L 27/088 438/301 |
| 2014/0197301 | A1* | 7/2014 | Velichko | H01L 27/14625 250/208.1 |
| 2015/0062392 | A1* | 3/2015 | Lenchenkov | H01L 31/02164 348/294 |
| 2015/0115382 | A1* | 4/2015 | Wu | H01L 27/14627 257/432 |
| 2016/0049438 | A1* | 2/2016 | Murata | H01L 27/14603 257/229 |
| 2016/0343756 | A1* | 11/2016 | Fan | H01L 27/14623 |
| 2017/0244921 | A1* | 8/2017 | Velichko | H01L 27/1461 |
| 2018/0083055 | A1* | 3/2018 | Kuwazawa | H04N 5/335 |
| 2018/0286905 | A1* | 10/2018 | Tsao | H01L 27/14627 |
| 2019/0195797 | A1* | 6/2019 | Cai | G01N 21/6454 |

* cited by examiner

GLOBAL SHUTTER CMOS IMAGE SENSOR AND METHOD FOR FORMING THE SAME

CROSS REFERENCE TO RELATED APPLICATIONS

This Application claims priority of Taiwan Patent Application No. 107121497, filed on Jun. 22, 2018, the entirety of which is incorporated by reference herein.

BACKGROUND

Technical Field

The disclosure relates to an image sensor, and more particularly to a global shutter CMOS image sensor.

Description of the Related Art

Image sensors are a necessary component in many electro-optical devices such as portable devices, digital cameras, and toys. Conventional image sensors include charge coupled device (CCD) image sensors and complementary metal oxide semiconductor (CMOS) image sensors.

Conventional image sensors use a rolling shutter. Due to the difference in the exposure time between pixel arrays, distortions may occur when shooting high-speed moving objects. With a global shutter, a storage element is arranged in the pixels. The signals obtained by exposing the photosensitive element may be stored first, and then the signals may be transferred at the same time. Therefore, image distortion may be reduced when shooting high-speed moving objects using the rolling shutter.

However, as the size of the pixels shrinks, the distance between the photosensitive element and the storage element is also shrunk. Light which should be incident on the photosensitive element may also escape to the storage element, causing parasitic light sensitivity (PLS) or global shutter efficiency (GSE) to get worse.

Although existing CMOS image sensor have generally been adequate for their intended purposes, they have not been entirely satisfactory in all respects and need to be improved. The parasitic light sensitivity (PLS) or the global shutter efficiency (GSE) of the CMOS image sensor in particular needs to be improved.

BRIEF SUMMARY

The present disclosure provides a global shutter CMOS image sensor. The global shutter CMOS image sensor includes a photodiode, a floating diffusion region, and a storage diode disposed in the upper portion of the substrate. The storage diode is disposed between the photodiode and the floating diffusion region. A first transfer gate is disposed on the substrate between the photodiode and the storage node. A second transfer gate is disposed on the substrate between the storage diode and the floating diffusion region. A first dielectric layer is disposed on the substrate and covers the first transfer gate and the second transfer gate. A light-shielding layer is disposed on the first dielectric layer. A light pipe is disposed through the light-shielding layer and a portion of the first dielectric layer, and is correspondingly disposed above the photodiode. The light pipe has a refractive index higher than that of the first dielectric layer.

The present disclosure also provides a method for forming a global shutter CMOS image sensor. The method for forming a global shutter CMOS image sensor includes forming a photodiode, a floating diffusion region, a storage diode in an upper portion of a substrate. The storage diode is disposed between the photodiode and the floating diffusion region. The method for forming a global shutter CMOS image sensor further includes forming a first transfer gate on the substrate between the photodiode and the storage diode. The method for forming a global shutter CMOS image sensor further includes forming a second transfer gate on the substrate between the storage diode and the floating diffusion region. The method for forming a global shutter CMOS image sensor further includes forming a first dielectric layer on the substrate, and the first dielectric layer covers the first transfer gate and the second transfer gate. The method for forming a global shutter CMOS image sensor further includes forming a light-shielding layer on the first dielectric layer. The method for forming a global shutter CMOS image sensor further includes removing a portion of the light-shielding layer on the first dielectric layer. The method for forming a global shutter CMOS image sensor further includes forming a hole in the upper portion of the first dielectric layer wherein the remaining light-shielding layer is used as a mask, and the hole is above the photodiode. The method for forming a global shutter CMOS image sensor further includes forming a light pipe in the hole. A refraction index of the light pipe is greater than that of the first dielectric layer.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A, 1B to FIG. 8 are schematic representations of various stages of forming a global shutter CMOS image sensor in accordance with some embodiments.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Although some embodiments are discussed with operations performed in a particular order, these operations may be performed in another logical order. In different embodiments, additional operations can be provided before, during, and/or after the stages described the present disclosure. Some of the stages that are described can be replaced or eliminated for different embodiments. Additional features can be added to the global shutter CMOS image sensor in the present disclosure. Some of the features described below can be replaced or eliminated for different embodiments.

The embodiments of the present disclosure provide a global shutter CMOS image sensor (GS CIS). By self-aligned forming a light pipe above the photodiode with a light-shielding layer, the incident light from above is confined inside the light pipe since the refractive index is greater than that of surrounding dielectric layer. Meanwhile, the light-shielding layer may also reflect or absorb the incident light, and the leakage light escaped to the storage diode may be reduced.

FIGS. 1 to 8 are cross-sectional representations of various stages of forming the global shutter CMOS image sensor 100 in accordance with some embodiments of the present disclosure. As shown in FIG. 1A, a substrate 102 is provided. In some embodiments, the substrate 102 may be elemental semiconductors including silicon or germanium; compound semiconductors including gallium nitride, silicon carbide, gallium arsenide, gallium phosphide, indium phosphide, indium arsenide, and/or indium antimonide; alloy semiconductors including SiGe, GaAsP, AlInAs, AlGaAs, GaInAs, GaInP, and/or GaInAsP, or a combination thereof. In some embodiments, the substrate 102 may also be a semiconductor on insulator (SOI) substrate. The above SOI substrate may include a base plate, a buried oxide (BOX) layer disposed on the base plate, and a semiconductor layer disposed on the buried oxide (BOX) layer.

Figure 1A:
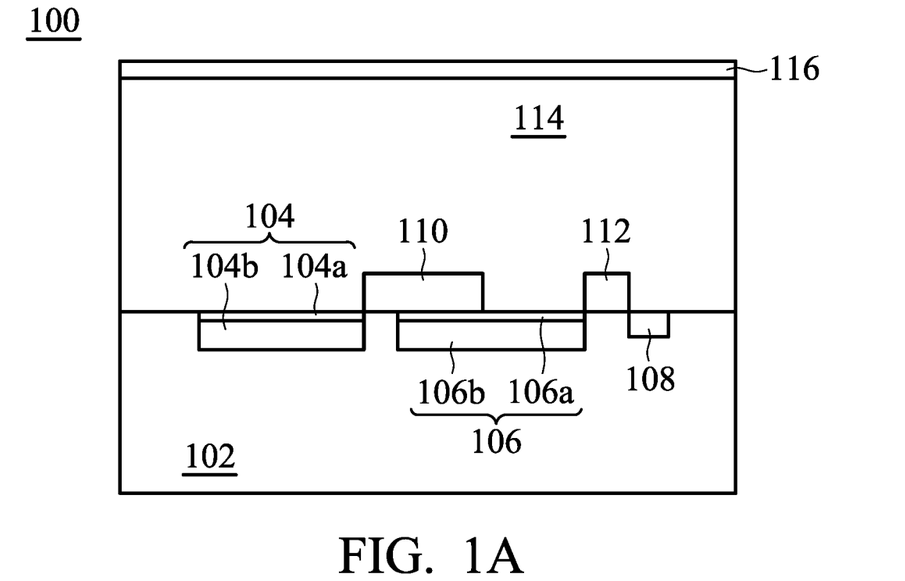

Next, as shown in FIG. 1A, a photodiode 104, a storage diode 106, and a floating diffusion 108 are formed in the upper portion of the substrate 102. In some embodiments, the photodiode 104 and the storage diode 106 are consisted of upper first doping regions 104a/106a and lower second doping regions 104b/106b respectively. In some embodiments, the first doping regions 104a/106a have a first conductive type, and the lower second doping regions 104b/106b have a second conductive tope. The second conductive type is opposite to the first conductive type. In some embodiments, the first conductive type is P type, and the second conductive type is N type. In some other embodiments, the first conductive type is N type, and the second conductive type is P type. In some embodiments, the second conductive type dopant concentration of the second doping region 104b of the photodiode 104 is lower than the second conductive type dopant concentration of the second doping region 106b of the storage diode 106. The first conductive type dopant concentration of the first doping region 104a of the photodiode 104 is the same as the first conductive type dopant concentration of the first doping region 106a of the storage diode 106. In this way, the storage diode 106 may be more easily to obtain the electrons of the photodiode 104, and the charge transfer efficiency is increased. In some embodiments, the first conductive type dopant concentration of the first doping regions 104a/106a in the upper photodiode 104 and the upper storage diode 106 is in a range from about $1E17/cm^3$ to about $1E19/cm^3$. The second conductive type dopant concentration of the second doping regions 104b/106b in the lower photodiode 104 and the lower storage diode 106 is in a range from about $1E15/cm^3$ to about $1E18/cm^3$. In some other embodiments, the first conductive type dopant concentration of the first doping regions 104a/106a and the second conductive type dopant concentration of the second doping regions 104b/106b may also be in other ranges, depending on the demand of the process.

In some embodiments, the photodiode 104 and the storage diode 106 are formed by doping dopant in the substrate 102. The P type dopant is, for example, B, Ga, Al, In, $BF_3^+$ ions, or a combination thereof. The N type dopant is, for example, P, As, N, Sb ions, or a combination thereof. In some embodiments, the photodiode 104 and the storage diode 106 may be formed by implanting the substrate 102 through a patterned mask layer (not shown) such as patterned photoresist. In some other embodiments, the patterned mask layer is a hard mask. In some embodiments, since the first conductive type dopant concentration of the first doping region 104a of the photodiode 104 and the first doping region 106a of the storage diode 106 are the same, after forming the second doping region 104b of the photodiode 104 and the second doping region 106b of the storage diode 106 by different masks respectively, the first doping region 104a of the photodiode 104 and the first doping region 106a of the storage diode 106 may be formed by the same mask, in order to save production cost and time. In some embodiments, the depth of the of the first doping regions 104a/106a in the upper photodiode 104 and the upper storage diode 106 is less than 100 nm, and the depth of the second doping regions 104b/106b in the lower photodiode 104 and the lower storage diode 106 is more than two times of the depth of the of the first doping regions 104a/106a in the upper photodiode 104 and the upper storage diode 106. The longer of the light wavelength applied by the global shutter CMOS image sensor 100, the deeper of the first doping regions 104a/106a and the second doping regions 104b/106b.

In some embodiments, the floating diffusion region 108 and the photodiode 104 are located on the opposite sides of the storage diode 106. In some embodiments, the floating diffusion region 108 has a second conductive type. The second conductive type dopant concentration of the floating diffusion region 108 is in a range from about $1E19/cm^3$ to about $1E22/cm^3$. In some embodiments, the second conductive type dopant concentration of the floating diffusion region 108 is higher than the second conductive type dopant concentration of the second doping region 106b of the storage diode 106. In this way, the charge transfer efficiency may be increased. In some embodiments, the floating diffusion region 108 may be formed by implanting the substrate 102 though a patterned mask (not shown) such as a patterned photoresist.

Figure 1B:
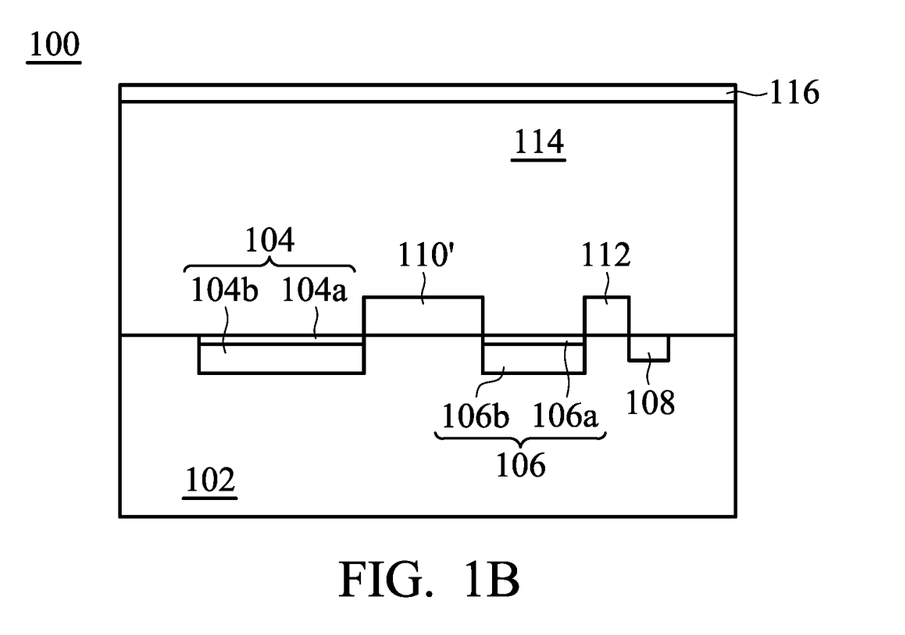

Next, as shown in FIG. 1A, a first transfer gate 110 is formed on the substrate 102 between the photodiode 104 and the storage diode 106, and a second transfer gate 112 is formed on the substrate 102 between the storage diode 106 and the floating diffusion region 108. In some embodiments as shown in FIG. 1A, the first transfer gate 110 may cover a portion of the storage diode 106. In some other embodiments as shown in FIG. 1B, the first transfer gate 110' does not cover the storage diode 106. In FIG. 1A, the first transfer gate 110 and the second transfer gate 112 may include a gate dielectric layer and a gate electrode layer disposed on the gate dielectric layer respectively (not shown). The gate dielectric layer may include silicon oxide, silicon nitride, or silicon oxynitride. The gate dielectric layer may be grown by an applicable oxidation process (such as a dry oxidation process or a wet oxidation process), a deposition process (such as a chemical vapor deposition process), other applicable processes, or a combination thereof. In some embodiments, the gate dielectric layer may be thermally grown by a thermal oxidation process in oxygen-containing ambient or nitrogen-containing ambient (such as NO or $N_2O$) to form the gate dielectric layer before forming the gate electrode layer. Alternatively, the gate dielectric layer may include a high-k dielectric layer (e.g., the dielectric constant is greater than 3.9) such as $HfO_2$, LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, $BaTiO_3$, $SrTiO_3$, $Al_2O_3$, other applicable high-k dielectric materials, or a combination thereof. The high-k dielectric layer may be formed by a chemical vapor deposition process (CVD) (e.g., a plasma enhanced chemical vapor deposition (PECVD) process, a metalorganic chemical vapor deposition (MOCVD) process, or a high density plasma chemical vapor deposition (HDP-CVD)), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

In some embodiments, the gate electrode layer is formed on the gate dielectric layer. The gate electrode layer may include polysilicon, metal (e.g., tungsten, titanium, aluminum, copper, molybdenum, nickel, platinum, the like, or a combination thereof), metal alloys, metal-nitrides (e.g., tungsten nitride, molybdenum nitride, titanium nitride, tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), other applicable materials, or a combination thereof. The gate electrode layer may be formed by forming an electrode material on the substrate 102 by a chemical vapor deposition (CVD) process (e.g., a low pressure chemical vapor deposition process (LPCVD), or a plasma enhanced chemical vapor deposition process (PECVD)), a physical vapor deposition process (PVD) (e.g., a resistive heating evaporation process, an e-beam evaporation process, or a sputtering process), an electroplating process, an atomic layer deposition process (ALD), other applicable processes, or a combination thereof. The electrode material is then patterned by a photolithography process and an etching process to form a gate electrode.

It should be noted that, in some embodiments, the first transfer gate 110 and the second transfer gate 112 may be formed at the same time by the same mask to perform the photolithography and etching process described above, in order to save production cost and time. In some other embodiments, the first transfer gate 110 and the second transfer gate 112 are formed separately.

Next, as shown in FIG. 1A, a first dielectric layer 114 is formed on the substrate 102. The dielectric material of the first dielectric layer 114 includes oxides, spin-on glass (SOG), low-k dielectric materials such as fluorinated silica glass (FSG) and hydrogen silsesquioxane (HSQ). The first dielectric layer 114 may be formed by forming a dielectric material on the substrate 102 by a high aspect ratio process (HARP) and/or a chemical vapor deposition (CVD) process (e.g., a high density plasma chemical vapor deposition (HDPCVD), a plasma enhanced chemical vapor deposition process (PECVD), a low pressure chemical vapor deposition process (LPCVD), or an atmospheric pressure chemical vapor deposition (APCVD) process). Next, a chemical mechanical polishing (CMP) process and/or an etching back process may be performed on the first dielectric layer 114 to planarize the first dielectric layer 114.

Next, as shown in FIG. 1A, a light-shielding layer 116 is blanketly formed on the first dielectric layer 114. In some embodiments, the light-shielding layer 116 is made of metal material. The material of the light-shielding layer 116 may include tungsten, aluminum, silicon nitride, tungsten nitride, metal nitride, metal oxide, other applicable materials, or a combination thereof. In some embodiments, the incident light may be shielded effectively if the absorptivity of the light-shielding layer 116 is greater than 90% to a light with a wavelength in a range from 400 nm to 1000 nm, the extinction coefficient of the light-shielding layer 116 is greater than 1, or the reflectivity of the light-shielding layer 116 is greater than 90%.

It should be noted that, the light-shielding layer 116 is a single layer as shown in FIG. 1A. However, the present disclosure is not limited thereto. The light-shielding layer 116 may have two or more layers of film layers, depending on the process demands. For example, if a single-layer light-shielding layer 116 is too thin due to process restriction, the thickness of the light-shielding layer 116 may be increased by using a multi-layer light-shielding layer 116, and the light-shielding effect may be enhanced. In some embodiments, different films of the light-shielding layers 116 may be made of different materials. In some other embodiments, different films of the light-shielding layers 116 may be made of the same material.

Figure 2:
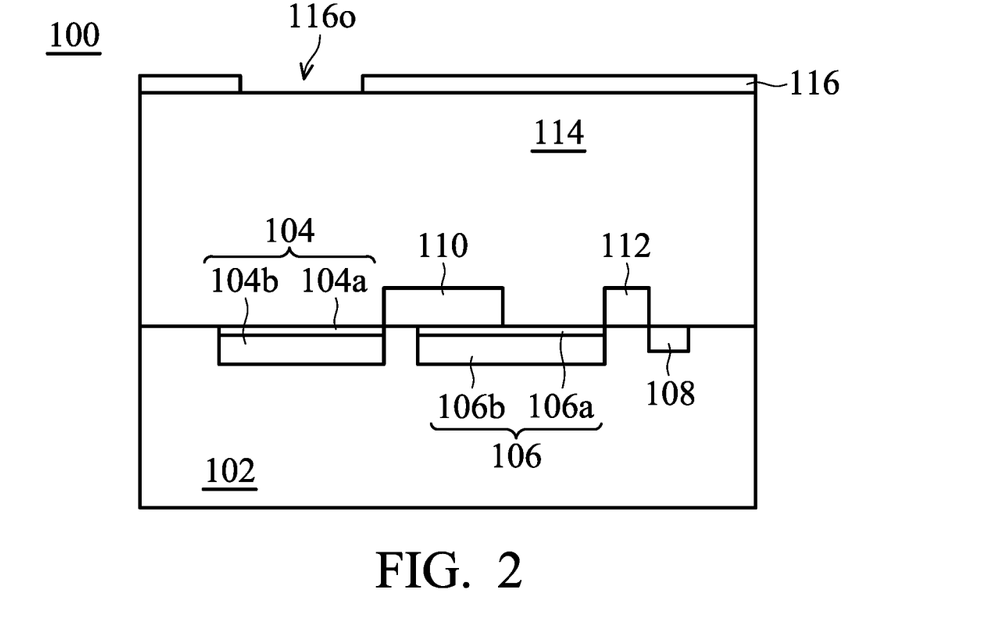

Next, as shown in FIG. 2, the light-shielding layer 116 on the first dielectric layer 114 is optionally removed. In some embodiments, the light-shielding layer 116 is optionally removed by a patterning process to form an opening 116o correspondingly above the photodiode 104. The patterning process may include photoresist coating (such as spin-on coating), soft baking, mask alignment, pattern exposure, post-exposure baking, photoresist development, rinsing and drying (e.g., hard baking), other applicable techniques, or a combination thereof. The etching process may include a dry etching process (e.g., reactive ion etching (RIE), a plasma etching method, an ion milling), a wet etching process, or a combination thereof.

Figure 3:
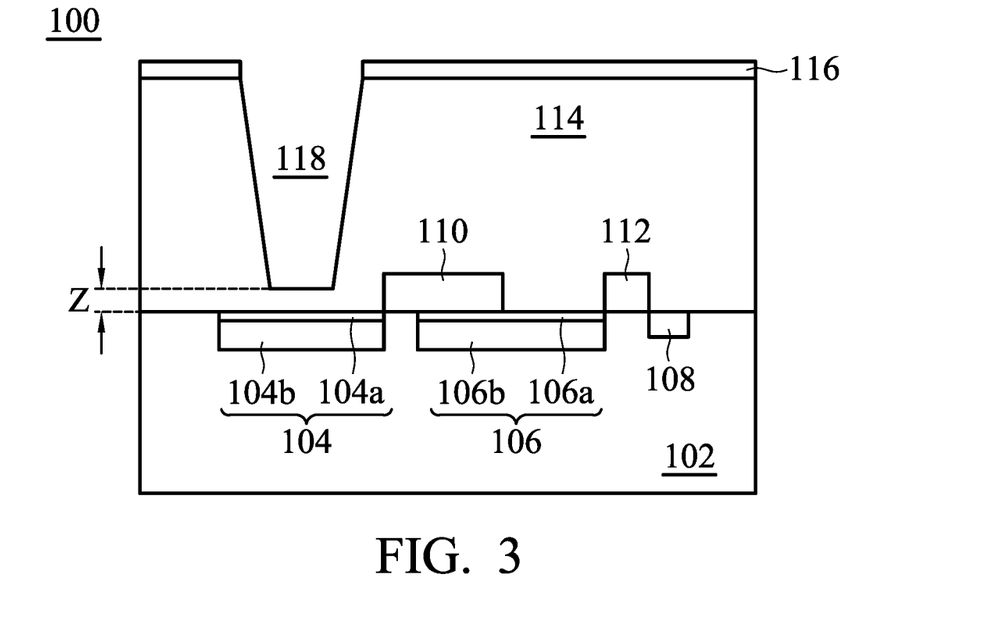

Next, as shown in FIG. 3, with the remaining light shielding layer 116 used as a mask, the underlying first dielectric layer 114 is etched along the opening 116o to form a hole 118 in an etching process. The etching process may include a reactive ion etching (RIE), a plasma etching method, or other applicable etching process. In some embodiments, the etching is through a portion of the first dielectric layer 114, and stops before the photodiode 104 is exposed. Therefore, the first dielectric layer 114 with a thickness z remains between the bottom of the hole 118 and the photodiode 104. In some other embodiments, the etching is through a portion of the first dielectric layer 114, and stops exactly when the photodiode 104 is exposed. Therefore, the thickness z of the first dielectric layer 114 between the bottom of the hole 118 and the photodiode 104 is zero.

Figure 4:
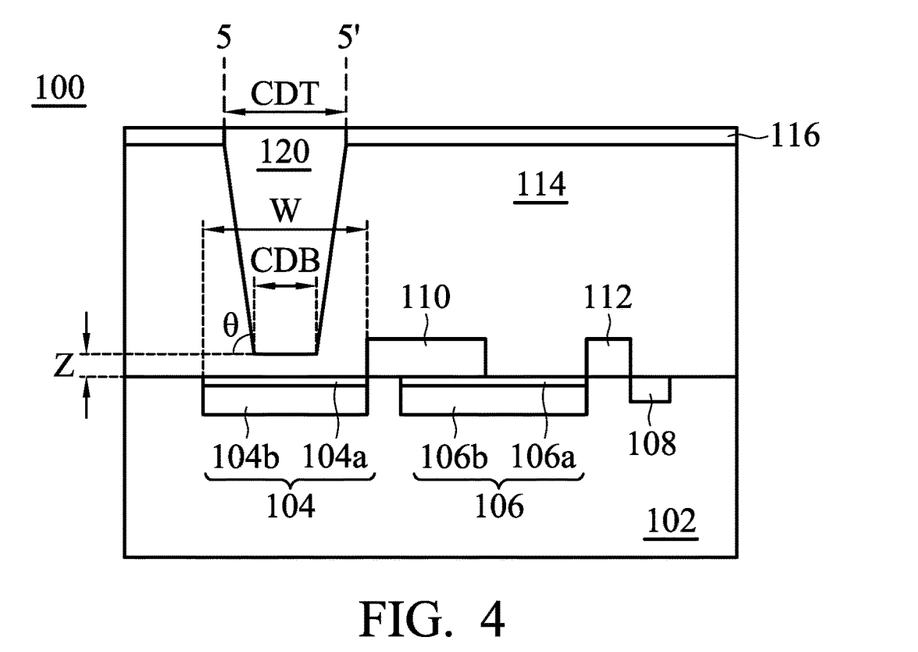

Next, as shown in FIG. 4, a material with high refractive index (such as a refractive index greater than 1.45) is filled in the hole 118 to form a light pipe 120. In some embodiments, the light pipe 120 may include poly(methyl methacrylate) (PMMA), perfluorocyclobutyl (PFCB) polymer, polyimide, epoxy resins, other suitable materials, or a combination thereof. In some embodiments, the light pipe material may be deposited on the light-shielding layer 116 and filled in the hole 118 by spin-on coating, chemical vapor deposition (CVD), physical vapor deposition (PVD) (e.g. evaporation or sputtering), electroplating, atomic layer deposition (ALD), other suitable processes, or a combination thereof, and an etching process is performed to remove excess light pipe material outside the hole 118. Next, a planarization process such as a chemical mechanical polishing (CMP) process may be performed on the light pipe 120 and the light-shielding layer 116 to planarize the upper surface of the light pipe 120 and the light-shielding layer 116. In some other embodiments, the planarization process may be performed directly to planarize the upper surface of the light pipe 120 and the light-shielding layer 116 after filling the light pipe material in the hole 118.

In some embodiments, the first dielectric layer 114 has a refractive index of around 1.45, and the light pipe 120 has a refractive index greater than 1.46, such as between 1.6 and 2.0. In this way, the incident light may be confined in the light pipe 120, and may not be easily refracted into the first dielectric layer 114. The incident light may be kept above the photodiode 104, and the light escaped to the storage diode 106 may be reduced.

In order to further reduce the light escaped to the storage diode 106, as shown in FIG. 4, the light pipe 120 is a structure with a wider upper width and a narrower lower width, and its upper diameter CDT is greater than its lower diameter CDB. By modifying the parameter of etching the hole 118, the profile of the light pipe 120 may be controlled. In some embodiments, the ratio between the upper diameter CDT and the lower diameter CDB of the light pipe 120 is between 1 and 3. That is, an angle θ between the sidewall of the light pipe 120 and the horizon is between 70 and 90. The greater the upper diameter CDT of the light pipe 120, the more incident light the light pipe 120 received, and the quantum efficiency (QE) may be increased. The narrower the lower diameter CDB of the light pipe 120, the incident light is ensured to be above the photodiode 104, and the light escaped to the storage diode 106 may be reduced. However, if the lower diameter CDB is too narrow, the point source diffraction may occur at the lower edge of the light pipe 120, and the light escaped to the storage diode 106 may increased.

Moreover, as shown in FIG. 4, a distance z between the bottom surface of the light pipe 120 and the photodiode 104 is in a range from about 0 nm to about 600 nm. Since the light may be diffracted at the bottom of the light pipe 120, if the distance z is too long, the light escaped to the storage diode 106 may increase. If the distances z is too short, it may be difficult to control the distance during the process.

Figure 5:
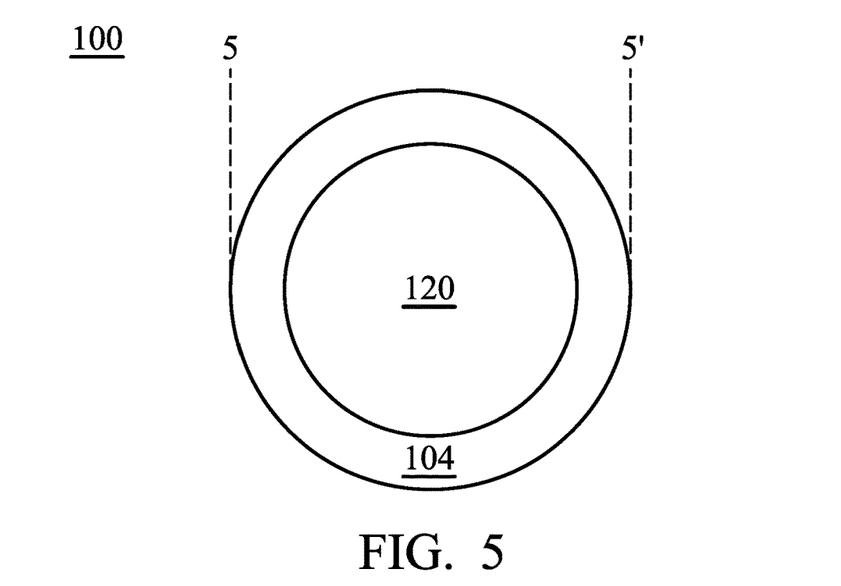

Please refer to FIG. 5. FIG. 5 is a partial top view of the global shutter CMOS image sensor 100 of FIG. 4 taken along line 5-5' in accordance with some embodiments of the present disclosure. For clarity, only the top view of the light pipe 120 and the photodiode 104 of the global shutter CMOS image sensor 100 is shown. As shown in FIG. 5, the projection of the light pipe 120 is within the range of the projection of the photodiode 104 in a top view. In this way, the bottom of the light pipe 120 is more far away from the storage diode 106, and the light escaped to the storage diode 106 is reduced. In some embodiments, the ratio of the upper diameter CDT of the light pipe 120 and the width W of the photodiode 104 is between 0.2 and 1.

Figure 6:
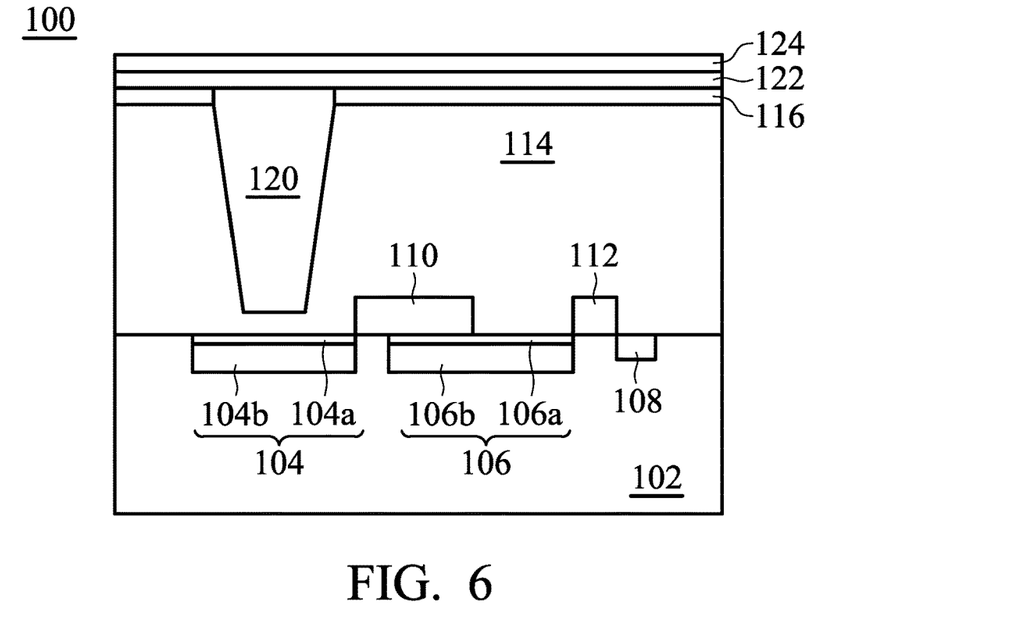

Next, as shown FIG. 6, a passivation layer 122 is blanketly covered on the light-shielding layer 116 and the light pipe 120. The passivation layer 122 may include $SiN_3$, $SiO_2$, SiON, $Al_2O_3$, AN, polyimide (PI), benzocyclobutene (BCB), polybenzoxazole (PBO), other dielectric materials, or a combination thereof. In some embodiments, the passivation layer 122 is formed on the light-shielding layer 116 and the light pipe 120 by a metalorganic chemical vapor deposition (MOCVD) process, a chemical vapor deposition process (CVD) (a low pressure chemical vapor deposition process (LPCVD), or a plasma enhanced chemical vapor deposition process (PECVD)), spin-on coating, other suitable method, or a combination thereof. The passivation layer 122 may protect the film layer underneath as a buffer between the film underneath and the film subsequently formed, and provide physical isolation and structural support. Afterwards, a chemical mechanical polishing (CMP) process may be performed on the passivation layer 122 to planarize the passivation layer 122.

Next, as shown in FIG. 6, an underlayer 124 is blanketly covered on the passivation layer 122. In some embodiments, the underlayer 124 may include organic materials such as acrylic resin, ethyl-3-ethoxypropionate (EEP), propylene glycol monomethyl ether acetate (PGMEA), other organic material, or a combination thereof. In some embodiments, the underlayer 124 is formed by spin-coating, chemical vapor deposition (CVD), physical vapor deposition (PVD) (e.g. evaporation or sputtering), electroplating, atomic layer deposition (ALD), other suitable processes, or a combination thereof. In some embodiments, the underlayer 124 is a non-photosensitive material.

Figure 7:
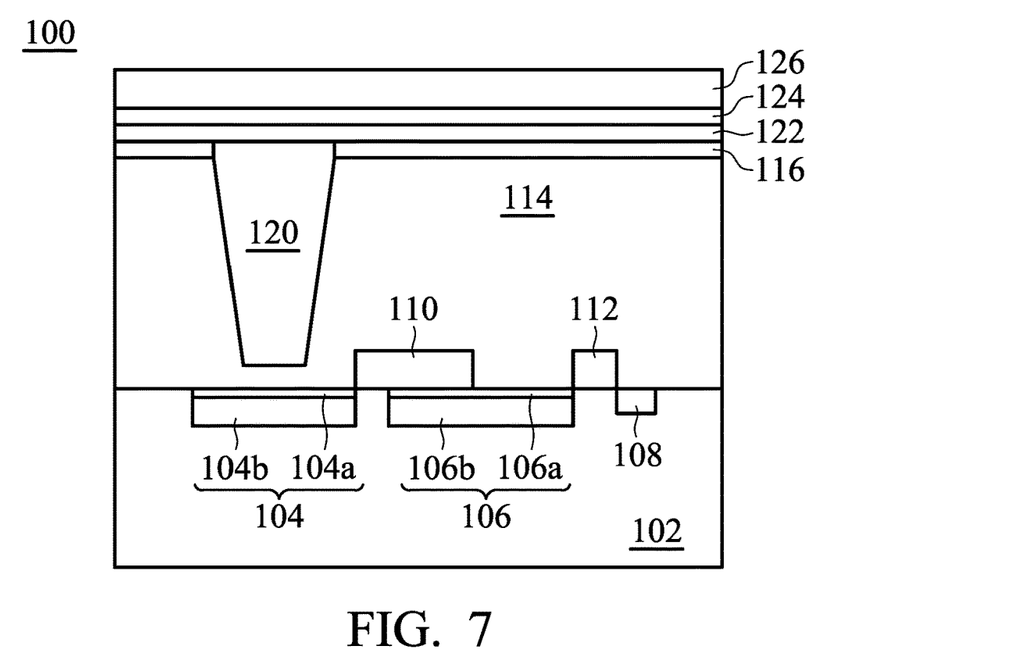

Next, as shown in FIG. 7, a color filter 126 is formed on the underlayer 124. In some embodiments, the color filter 126 is located above the light pipe 120. The color filter 126 may have different colors such as red, green, or blue. The color filter 126 may be formed by dye-based polymer or pigment-based polymer. The color filter 126 may be formed on the underlayer 124 by forming color filter material on the underlayer 124 by process such as spin-coating, spraying, etc., and the color filter material is then patterned by process such as alignment, exposure, developing, baking, etc. In some embodiments, in different pixels of global shutter CMOS image sensor 100, color filters 126 of different colors are formed by similar method. In some embodiments, the color filter 126 includes photosensitive material or photoresist material such as negative photoresist.

It should be noted that, the wavelength of the light in the light pipe 120 under color filters 126 of different colors are different. Therefore, the light pipe 120 under color filters 126 of different colors may have different shapes and refractive indexes, making incident light of different wavelength confined in the light pipe 120 and not easily refracted in the first dielectric layer 114, reducing the light escaped to the storage diode 106.

Figure 8:
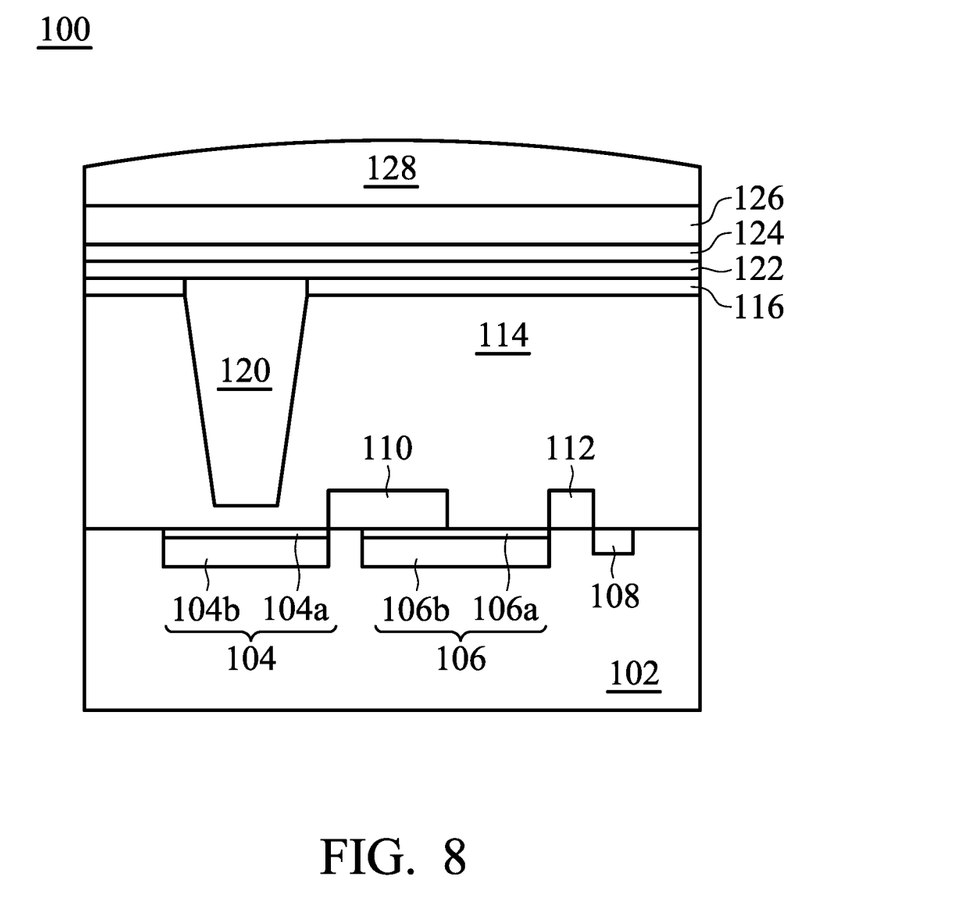

Next, as shown in FIG. 8, a microlens 128 is formed on the color filter 126. In some embodiments, the microlens 128 is above the light pipe 120. The microlens 128 may include quartz, gallium phosphide, calcium fluoride, silicon, other suitable material, or a combination thereof. The microlens 128 may be formed by photoresist heat reflow method, laser writing method, gray-scale mask method, non-contact molding method, other suitable method, or a combination thereof. The microlens 128 is used to guide the incident light through corresponding color filter 126 and corresponding light pipe 120 to corresponding photodiode 104. In some embodiments, the microlens 128 may focus the incident light, making the light converging on the photodiode 104, and reduce the light escaped to the storage photodiode 106.

In some embodiments, an interconnect structure such as metal lines, contact plugs, vias may be formed in the first dielectric layer 114 (not shown). The interconnect structure may also shield the light, which may help to reduce the light incident to the storage diode 106. In some embodiments, the interconnect structure is adjacent to the light pipe 120. In some other embodiments, the interconnect structure is spaced apart from the light pipe 120.

In some embodiments, by arranging the light pipe 120 and the light-shielding layer 116 of the global shutter CMOS image sensor 100 as shown in FIG. 8, the ratio of the light amount absorbed by the photodiode 104 and the storage diode 106 may be improved by an order of magnitude.

As mentioned above, by using the light-shielding layer as a mask in the global shutter CMOS image sensor, a light pipe with higher refractive index is formed above the photodiode by a self-alignment method, confining the incident light in the light pipe. In addition, the light-shielding layer may also reflect or absorb the incident light. Therefore, the incident light may converge on the photodiode, and the light escaped to the adjacent storage photodiode may be reduced.

It should be noted that, although the light pipe 120 is formed by using the remaining light-shielding layer 116 as a mask layer, this method is merely an example, and the present disclosure is not limited thereto. In the present disclosure, the light pipe 120 may also be formed in another self-aligned process to form a light pipe 120 that is seamless with the light-shielding layer 116.

Figure 9:
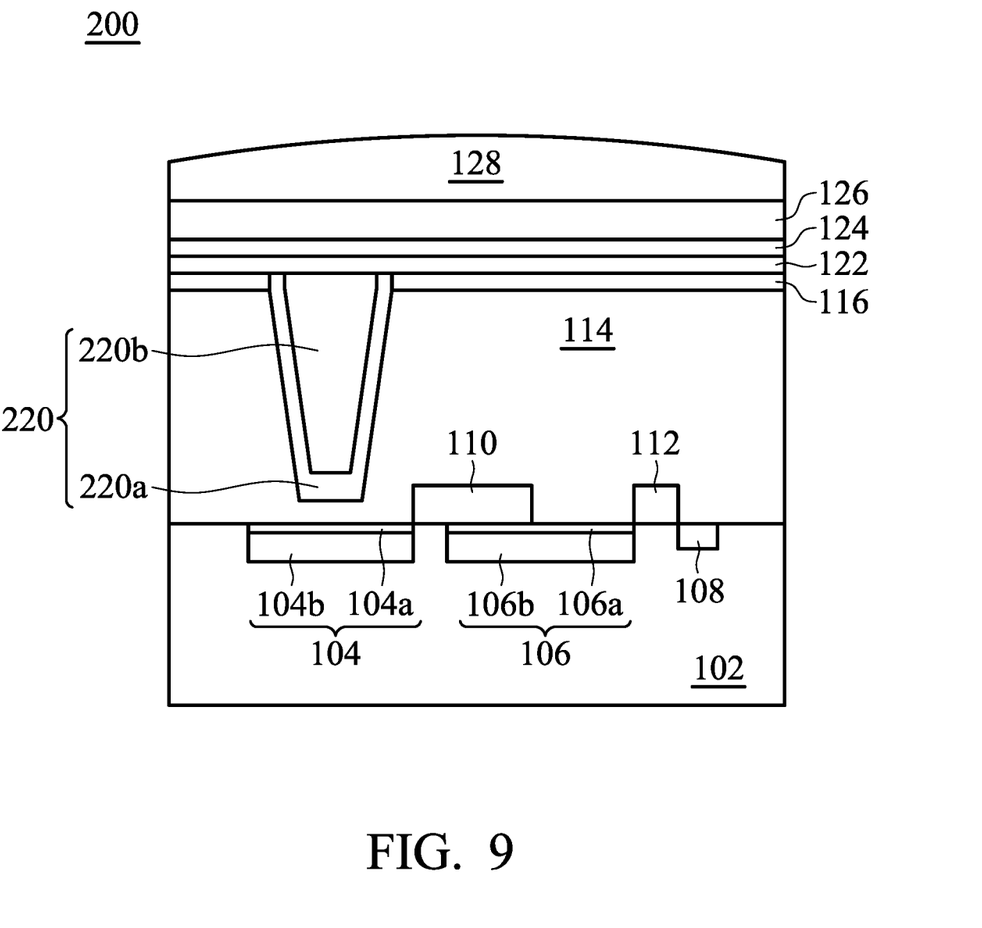
FIG. 9 is a schematic representation of a global shutter CMOS image sensor in accordance with some other embodiments.

FIG. 9 is a cross-sectional representation of a global shutter CMOS image sensor 200 in accordance with some other embodiments. Some processes or devices are the same as, or similar to, those described in the embodiments above, and therefore the descriptions, the reference numerals, and/or letters may be repeated herein. The difference from the embodiments described above is that, as shown in FIG. 9 in accordance with some embodiments, the light pipe 220 includes the first portion 220a and the second portion 220b. In some embodiments, the refractive index of the first portion 220a of the light pipe 220 is less than that of the second portion 220b. For example, the first portion 220a of the light pipe 220 and the second portion 220b of the light pipe 220 may include poly(methyl methacrylate) (PMMA), perfluorocyclobutyl (PFCB) polymer, polyimide, epoxy resins, other suitable materials, or a combination thereof. In some embodiments, the refractive index of the first portion 220a of the light pipe 220 and the second portion 220b of the light pipe 220 is greater than 1.46, such as between 1.6 and 2.0. In some other embodiments, the first portion 220a of the light pipe 220 may be anti-reflection layer of alternatively arranged high refractive index material such as $TiO_2$ and low refractive index material such as $SiO_2$ or $MgF_2$. In this way, the light may be further ensured to be confined in the light pipe 220, and the light escaped to the storage diode 106 may be reduced.

In some embodiments, the first portion 220a of the light pipe 220 may be conformally formed in the opening 118 in the embodiments as shown in FIG. 3 by chemical vapor deposition (CVD), physical vapor deposition (PVD) (e.g. evaporation or sputtering), electroplating, atomic layer deposition (ALD), other suitable processes, or a combination thereof. The opening 118 is then filled up by the second portion 220b of the light pipe 220. Next, a planarization process such as a chemical mechanical polishing (CMP) process may be performed on the light pipe 220 and the light-shielding layer 116 to planarize the upper surface of the first portion 220a and the second portion 220b of the light pipe 220 and the light-shielding layer 116.

In the embodiments as shown in FIG. 9, by arranging two or more layers of materials with different refractive indexes in the light pipe, the incident light may be further ensured to be confined in the light pipe, and the light escaped to the storage diode may be reduced.

It should be noted that, the number of film layers of the light pipe is merely an example, and the present disclosure is not limited thereto. In the present disclosure, the light pipe may also include three or more layers of refractive index materials, depending on the demand of the process.

Figure 10:
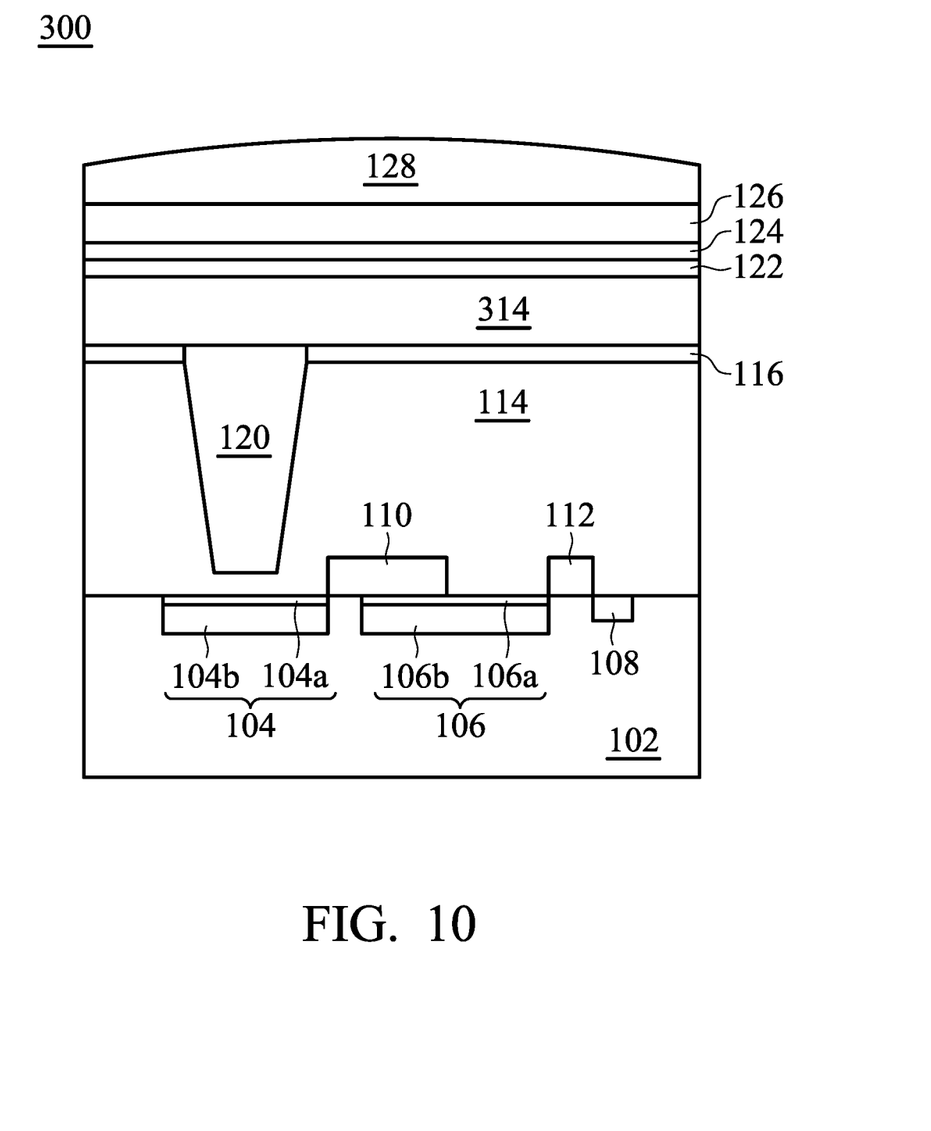
FIG. 10 is a schematic representation of a global shutter CMOS image sensor in accordance with some further embodiments.

FIG. 10 is a cross-sectional representation of a global shutter CMOS image sensor 300 in accordance with some other embodiments. Some processes or devices are the same as, or similar to, those described in the embodiments above, and therefore the descriptions, the reference numerals, and/or letters may be repeated herein. The difference from the embodiments described above is that, as shown in FIG. 10 in accordance with some embodiments, a second dielectric layer 314 is between the light pipe 120, the light-shielding layer 116, and the passivation layer 122. In some embodiments, the material of the second dielectric layer 314 is the same as that of the first dielectric layer 114. In some other embodiments, the material of the second dielectric layer 314 is different than that of the first dielectric layer 114. The dielectric material of the second dielectric layer 314 may include oxides, spin-on glass (SOG), low-k dielectric materials such as fluorinated silica glass (FSG) and hydrogen silsesquioxane (HSQ). The second dielectric layer 314 may be formed by forming a dielectric material on the light pipe 120 and the light-shielding layer 116 by a high aspect ratio process (HARP) and/or a chemical vapor deposition (CVD) process (e.g., a high density plasma chemical vapor deposition (HDPCVD), a plasma enhanced chemical vapor deposition process (PECVD), a low pressure chemical vapor deposition process (LPCVD), or an atmospheric pressure chemical vapor deposition (APCVD) process). Next, a chemical mechanical polishing (CMP) process and/or an etching back process may be performed on the second dielectric layer 314 to planarize the second dielectric layer 314.

In the embodiments as shown in FIG. 10, the light-shielding layer is between two dielectric layers, and the light pipe only locates in the lower dielectric layer 114. Since the light is focused by the microlens 128, the lower light spot area is smaller. Therefore, compared to the embodiments as shown in FIG. 8, when the upper diameter CDT of the light pipe 120 is the same, the incident light is more easily to focus in the light pipe 120 in the lower dielectric layer 114. The incident light may be further ensured to be confined in the light pipe, and the light escaped to the storage diode may be reduced.

As mentioned above, the present disclosure provides a global shutter CMOS image sensor. By using the light-shielding layer as a mask, a light pipe is formed above the photodiode by a self-aligned method. The refractive index of the light pipe is greater than the refractive index of the dielectric layer, and the incident light may be confined in the light pipe. The light illuminates the light-shielding layer may also be reflected or absorbed by the light-shielding layer. In this way, the amount of the light escaped to the storage diode may be reduced.

It should be noted that although the advantages and effects of some embodiments of the present disclosure have been described above, not all embodiments are required to achieve all of the advantages and benefits.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A global shutter Complementary Metal-Oxide-Semiconductor (CMOS) image sensor, comprising:
    a photodiode disposed in an upper portion of the substrate;
    a floating diffusion region disposed in the upper portion of the substrate;
    a storage diode disposed in the upper portion of the substrate, and the storage diode is disposed between the photodiode and the floating diffusion region;
    a first transfer gate disposed on the substrate between the photodiode and the storage diode;
    a second transfer gate disposed on the substrate between the storage diode and the floating diffusion region;
    a first dielectric layer that is disposed on the substrate and that covers the first transfer gate and the second transfer gate;
    a light-shielding layer disposed on the first dielectric layer; and
    a light pipe through the light-shielding layer and a portion of the first dielectric layer, and correspondingly disposed above the photodiode,
    wherein a refractive index of the light pipe is higher than a refractive index of the first dielectric layer,
    wherein the light-shielding layer comprises at least two film layers.

2. The global shutter CMOS image sensor as claimed in claim 1, wherein a projection of the light pipe is within range of a projection of the photodiode in a top view.

3. The global shutter CMOS image sensor as claimed in claim 1, wherein an upper diameter of the light pipe is greater than a lower diameter of the light pipe.

4. The global shutter CMOS image sensor as claimed in claim 1, wherein a ratio of the upper diameter of the light pipe to the lower diameter of the light pipe is in a range from about 1 to about 3.

5. The global shutter CMOS image sensor as claimed in claim 1, wherein a ratio of the upper diameter of the light pipe to a width of the photodiode is in a range from about 0.2 to about 1.

6. The global shutter CMOS image sensor as claimed in claim 1, wherein a distance between a bottom surface of the light pipe and the photodiode is in a range from about 0 nm to about 600 nm.

7. The global shutter CMOS image sensor as claimed in claim 1, wherein the light pipe comprises poly(methyl methacrylate) (PMMA), perfluorocyclobutyl (PFCB) polymer, polyimide, or epoxy resins.

8. The global shutter CMOS image sensor as claimed in claim 1, wherein a refraction index of the light pipe is greater than 1.46.

9. The global shutter CMOS image sensor as claimed in claim 1, wherein the light pipe comprises two or more materials with different refraction indexes.

10. The global shutter CMOS image sensor as claimed in claim 1, wherein the light-shielding layer comprises tungsten, aluminum, silicon nitride, tungsten nitride, metal nitride, metal oxide, or a combination thereof.

11. The global shutter CMOS image sensor as claimed in claim 1, wherein an extinction coefficient of the light-shielding layer is greater than 1, and a reflectivity of the light-shielding layer is greater than 90%.

12. The global shutter CMOS image sensor as claimed in claim 1, further comprising:
    a second dielectric layer disposed on the light-shielding layer and the light pipe.

13. The global shutter CMOS image sensor as claimed in claim 1, further comprising:
    a passivation layer blanketly covering the light-shielding layer;
    an underlayer blanketly covering the passivation layer;
    a color filter disposed on the underlayer and above the light pipe; and
    a microlens disposed on the color filter and above the light pipe.

14. A method of forming a global shutter CMOS image sensor, comprising:
    forming a photodiode, a floating diffusion region, and a storage diode in an upper portion of a substrate, wherein the storage diode is disposed between the photodiode and the floating diffusion region;
    forming a first transfer gate on the substrate between the photodiode and the storage diode;
    forming a second transfer gate on the substrate between the storage diode and the floating diffusion region;
    forming a first dielectric layer on the substrate, wherein the first dielectric layer covers the first transfer gate and the second transfer gate;
    forming a light-shielding layer on the first dielectric layer;
    removing a portion of the light-shielding layer on the first dielectric layer;
    forming a hole in an upper portion of the first dielectric layer with the remaining light-shielding layer being used as a mask, wherein the hole is above the photodiode; and
    forming a light pipe in the hole, wherein a refraction index of the light pipe is greater than a refraction index of the first dielectric layer.

15. The method for forming a global shutter CMOS image sensor as claimed in claim 14, wherein a projection of the light pipe is within range of a projection of the photodiode in a top view.

16. The method for forming a global shutter CMOS image sensor as claimed in claim 14, wherein an upper diameter of the light pipe is greater than a lower diameter of the light pipe.

17. The method for forming a global shutter CMOS image sensor as claimed in claim 14, wherein the light pipe comprises two or more materials with different refraction indexes.

18. The method for forming a global shutter CMOS image sensor as claimed in claim 14, wherein the light-shielding layer comprises at least two film layers.

19. The method for forming a global shutter CMOS image sensor as claimed in claim 14, further comprising:
   forming a second dielectric layer on the light-shielding layer and the light pipe.

* * * * *